United States Patent [19]

Kim

[11] Patent Number: 4,979,662
[45] Date of Patent: Dec. 25, 1990

[54] DESOLDERING VAT

[76] Inventor: Henry I. Kim, 7888 Silverton Ave., San Diego, Calif. 92126

[21] Appl. No.: 403,168

[22] Filed: Sep. 5, 1989

[51] Int. Cl.$^5$ .............................................. B23K 3/00
[52] U.S. Cl. ..................................... 228/56.1; 228/19
[58] Field of Search ..................... 228/56.1, 56.2, 264, 228/191, 119, 19, 259, 262, 179

[56] References Cited

U.S. PATENT DOCUMENTS

| | | | |
|---|---|---|---|
| 466,580 | 1/1892 | Slemmer | 228/56.2 |
| 3,056,015 | 9/1962 | Lovelace | 228/262 |
| 3,303,983 | 2/1967 | Patrick et al. | 228/180.1 |
| 3,815,806 | 6/1974 | Paxton | 228/264 |
| 4,456,163 | 6/1984 | Zach | 228/56.1 |
| 4,506,820 | 3/1985 | Brucker | 228/56.1 |

*Primary Examiner*—Sam Heinrich
*Attorney, Agent, or Firm*—Ralph S. Branscomb

[57] ABSTRACT

A desoldering vat includes a narrow, elongated, solder pot filled with liquid solder which actually extends slightly above the pot due to the meniscus, and is used to desolder the multiple pins of electronic components, especially elongated components such as edge connectors, which could be as long as 14″, with three rows of pins. Adjustable braces on both sides of the pot allow the worker to rest a circuit board against the brace and pot such that the depending pins of the pass-through pins of the components extend into the solder, with the solder in most instances touching the bottom of the printed circuit board. All the pins of the component are thus heated to molten solder temperature at once, permitting the easy removal of the component from the top of the board.

10 Claims, 2 Drawing Sheets

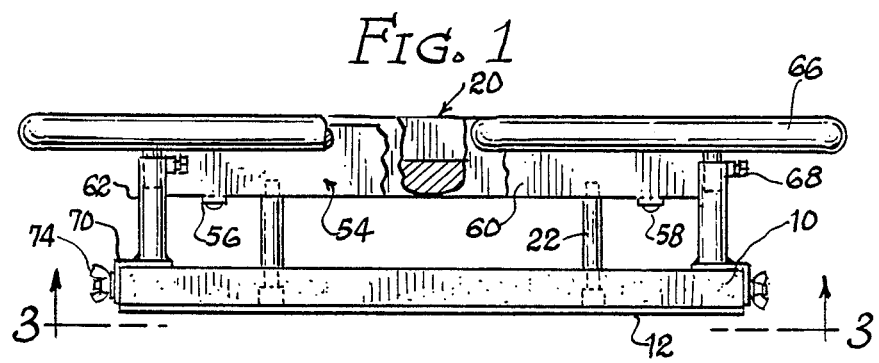
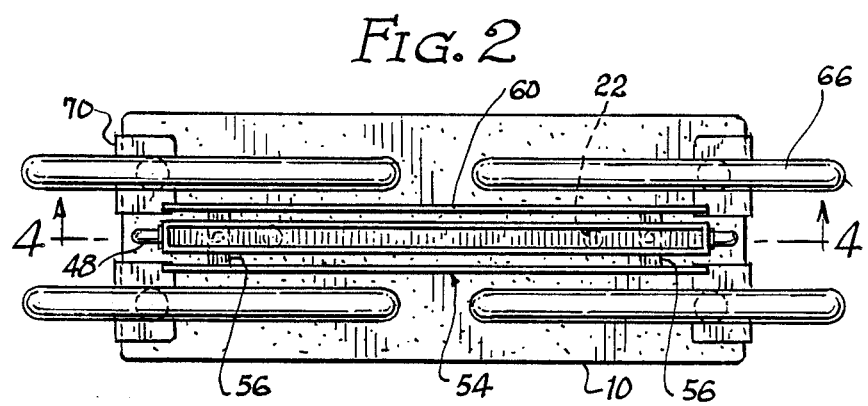
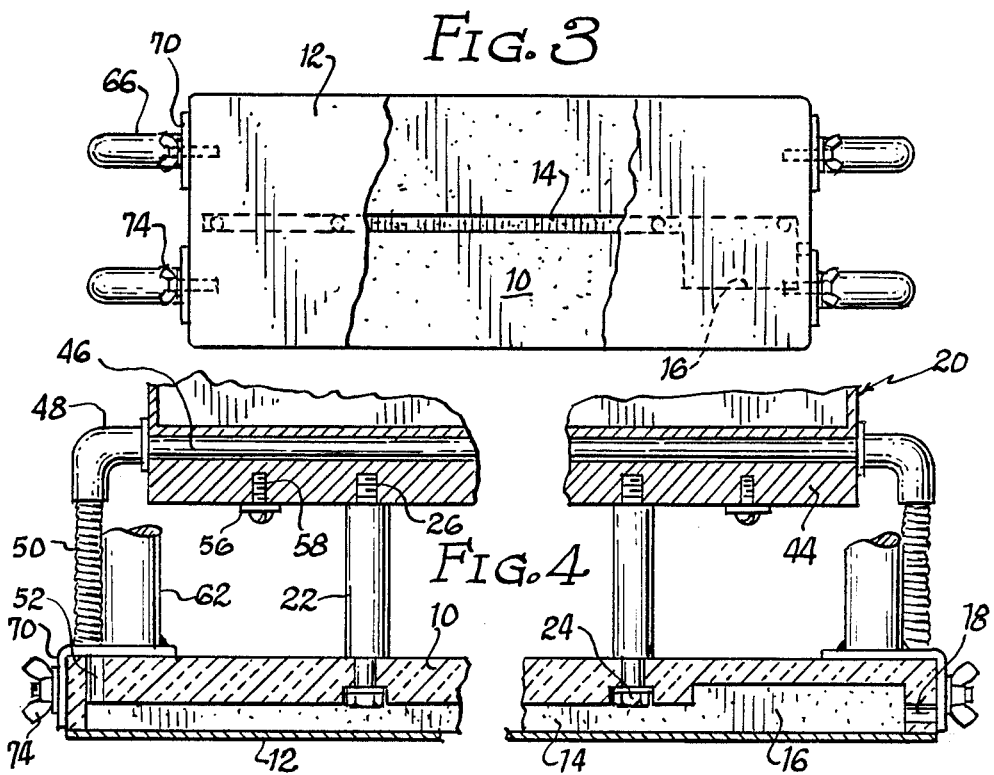

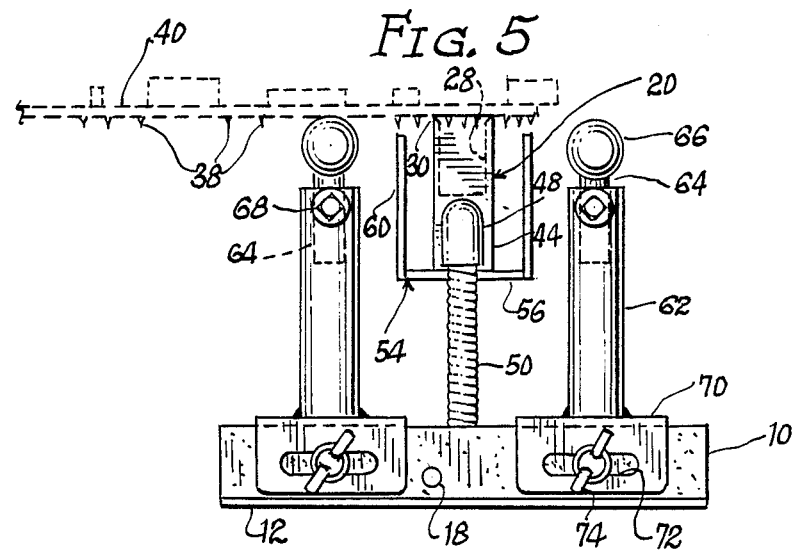
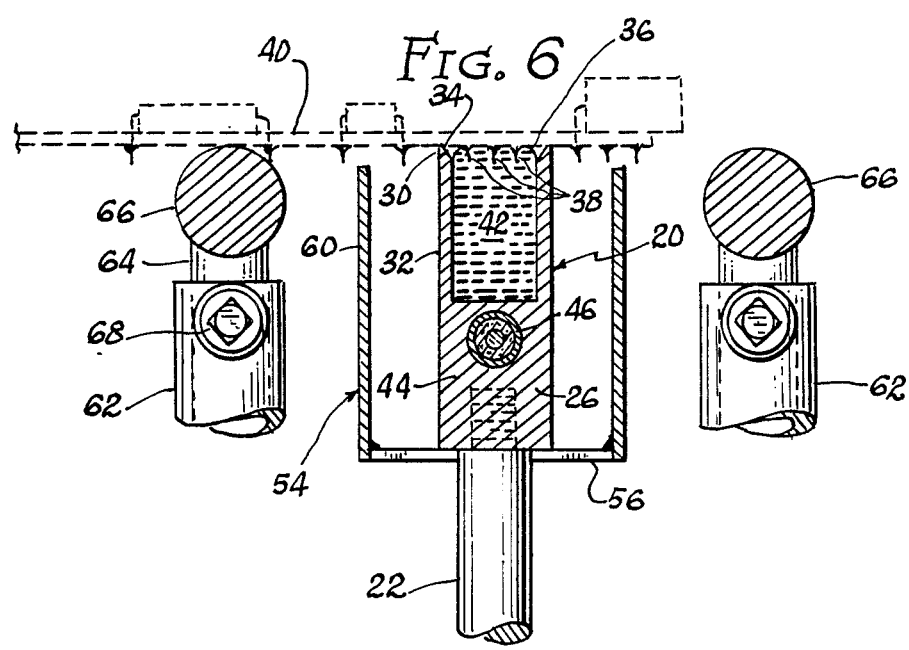

DESOLDERING VAT

BACKGROUND OF THE INVENTION

In the manufacturing and testing of printed circuit boards, and in some instances during the repair of printed circuit boards, components must be removed from the board. This naturally involves melting the solder holding the pins to the board. There are several techniques for melting the solder which mounts the pins and subsequently removing the component from the board.

Probably the oldest method of solder removal is the use of a braided copper solder wick. This is the method used by home hobbyists, and is tedious when used with components with numerous pens, to the point of being nearly impossible when hundreds of pins are involved. One principal problem is that if the component is not easily removable after wicking each pin, it is not apparent which pins are still stuck.

A second method utilizes a soldering iron heating element in conjunction with a tiny vacuum which sucks the solder out of the holes as it is melted. This is more effective than the wicking technique, but it is nevertheless very tedious and time-consuming when a number of pins are involved and suffers from the same drawback of not knowing which pin is stuck if the component will not come out at its socket.

Yet another method involves use of a prior patent obtained by applicant entitled METHOD FOR SOLDERING AND DESOLDERING ELECTRONIC COMPONENTS, U.S. Pat. No. 4,771,932, issued Sept. 20, 1988. This technique involves the use of a very wide and sharp soldering blade which is applied to all of the pins in one row at once, so that one edge of the component can be pried up, with the blade subsequently being applied to the opposite line of pins, with that side being pried up, and so forth, until the component is worked out of its socket. For components having pin rows no longer than an inch and a half or so, this technique will work, and is much superior to those previously mentioned. However, since some components have pin rows several inches long, such as an edge connector which may have a 14" triple row of pins, this technique is ineffective.

There is a need for an apparatus and a technique for desoldering all of the pins of a single dual-space or triple-space in-line package up to several inches long, without affecting the other portions of the circuit board.

SUMMARY OF THE INVENTION

The instant invention fulfills the above stated need and comprises a desoldering vat having a long, narrow solder pot, which is ¾ wide and preferably 14" long to accommodate the longest edge connector. The interior width of the solder pot is just over half an inch wide and will accommodate dual and triple in-line packages of standard dimension, without affecting pins of adjacent components which need not be removed.

Because the work requires some precision, four adjustable braces which have parallel bars extending along the solder pot are mounted to the underlying support base, permitting the circuit board to be rested against the brace, once it is properly adjusted for height and lateral spacing, if necessary, and subsequently rotated down against the upper edges of the solder pot dipping the appropriate pins into the molten solder to permit the component to be removed all at once.

BRIEF DESCRIPTION OF THE DRAWINGS

FIG. 1 is a side elevation of the invention with portions cut away;

FIG. 2 is a top plan view of the invention;

FIG. 3 is a bottom plan view taken along 3—3 of FIG. 1 showing portions of the bottom cover plate cut away to reveal the channel of the base;

FIG. 4 is a section taken along 4—4 of FIG. 2;

FIG. 5 is an end view of the invention with portions of the solder pot and support bars sectioned and showing a circuit board in phantom to illustrate the operation of the invention; and FIG. 6 is an enlarged transverse section showing the solder pot and the way the circuit board lies across the support board and solder pot with pins depending into the molten solder.

DETAILED DESCRIPTION OF THE PREFERRED EMBODIMENT

The elements of the invention are mounted to a planar base 10 which is covered by plate 12 on the bottom and is routed out underneath as best shown in FIG. 3, to define an elongated channel 14 with a widened region 16, and pass-through opening 18 for the power cable.

The central pot 20 is supported above the base plate by bolts 22 which define holders and threaded extensions at both ends. The bottom end passes through the base and is engaged by a nut 24 in a recessed area of the channel 14, and the upper end 26 screws directly into the bottom of the solder pot 20.

The pot 20 can be up to 14" long to accommodate the longest edge connectors, and is three-quarters inch in overall width, with 1/10" walls, for a net interior diameter of 0.55". The pot is 2" tall, with the actual solder reservoir 28 occupying one vertical inch with the bottom being solid. The upper edges 30 of the sidewalls are bevelled as shown at 34 to permit a meniscus to form, as shown at 36, in FIG. 6, while leaving a small space for expansion so that when the circuit board is placed on top of the pot, solder will not spill over. Because the number of pins 38 of the circuit board 40 which will enter the vat varies, the amount of molten solder 42 needed to perfectly accommodate the depending pins, touching the bottom of the circuit board without spilling over, will vary from desoldering to the next. The bevel accommodates some variation in cumulative pin volume.

The bottom portion 44 of the solder pot is solid metal, except for a bore entering from each end which is filled by heating bars 46. These heating bars are each wired through a connector 48, through the flexible conduit 50 to extend down through vertical bores 52 into the channel 14. The wires from the two flexible conduits are joined in the area 16 and connect with the power cord which passes through the opening 18 where it plugs into a variable power supply such as the ESMI, INC., Brush Tip ™.

In addition to being connected to the bolts or posts 22, the pot mounts a safety guard 54 which has two straps 56 which are screwed into the bottom of the pot at 58. The safety guard is connected by two straps only, with no other horizontal sheet metal being present that would hang up solder that drips over the edges of the pot.

The sides 60 of the safety guard are spaced from the pot as shown in FIG. 5, and do not extend up vertically quite to the plane of the top of the pot for obvious reasons of clearance. Although the spaced sides of the guard will no doubt become quite warm, if the operator accidentally touches the guard, obviously the burn, if any, will not be nearly so severe as if the pot were touched.

Turning now to the support braces, in the preferred embodiment there are four of them on the four quadrants of the apparatus. Four are used rather than two to provide a clearance for the hand of the operator midpoint along the vat. This is very important in allowing the operator fine control of the edge of the board that may fall more or less centrally of the solder pot.

Each brace has an upright post 62 which is hollow, at least in its upper portions, and receives the depending post 64 which is brazed or otherwise attached to the hollow, cylindrical aluminum brace bar 66. The post 64 is maintained at adjustable vertical settings by means of a set screw 68.

The set screw will also permit the brace bar to pivot about the vertical axis, although this would not normally be necessary when the apparatus is used as intended. However, vertical adjustment is indeed necessary as there are times when a component on the bottom of the board will require that the brace bar 66 be lowered so that the component can rest on the brace and the bottom of the brace will still lie flat across the upper edges 30 of the pot as shown in FIGS. 5 and 6.

For similar reasons of accommodating different board structures, each brace is made laterally adjustable so that the spacing of the bar from the pot may vary. To accomplish this, the post 62 is mounted on a right angle bracket 70 which is slotted at 72. A threaded post is imbedded orothogonally into the base, and a wing nut 74 engages on this post so that the entire support brace may be adjusted back and forth as can be most easily visualized by reference to FIG. 5.

Considerable flexibility of board support is provided by the multiple adjustability of the support braces The brace can be set up specifically for removal of a particular component from a particular board. Although it might seem time consuming to reset the brace for a particularly board, it must be borne in mind that this can be done in seconds, whereas removal of a single component can take up to three or four hours, using conventional techniques.

The desoldering vat described and claimed herein is one a series of innovations and techniques and devices made by the inventor of the instant invention to increase production speed efficiency of circuit board manufacturers that produce runs of boards from a single unit, to several thousand. Although sophisticated component positioning equipment, solder baths, and other advanced devices are increasingly routinely used, the industry remains labor-intensive, but becomes less so as increasingly sophisticated task-assisting devices, such as this one, are created and introduced to the industry.

I claim:

1. A desoldering vat comprising:
(a) an elongated solder pot for containing molten solder and having parallel sidewalls with upper edges defining a horizontal plane;
(b) means for heating solder in said pot to the molten state and maintaining same molten;
(c) a support brace having a bar with its upper side substantially at the level of said plane, whereby a circuit board can be rested across said bar and upper edges, with soldered component pins of a circuit board depending into said pot such that the heat from said molten solder melts the solder around said pins to free said component for removal from said board;
(d) the bar of said support brace running parallel to, and being spaced from, said pot; and,
(e) said support brace being vertically adjustable.

2. The structure according to claim 1 wherein said vertically adjustable support brace is duplicated on the opposite side of said pot to produce a bracket pair.

3. A desoldering vat comprising:
(a) an elongated solder pot for containing molten solder and having parallel sidewalls with upper edges defining a horizontal plane;
(b) means for heating solder in said pot to the molten state and maintaining same molten;
(c) a support brace having a bar with its upper side substantially at the level of said plane, whereby a circuit board can be rested across said bar and upper edges, with soldered component pins of a circuit board depending into said pot such that the heat from said molten solder melts the solder around said pins to free said component for removal from said board;
(d) the bar of said support brace running parallel to, and being spaced from, said pot;
(e) said support brace being vertically adjustable;
(f) said vertically adjustable support brace being duplicated on the opposite side of said pot to produce a bracket pair; and,
(g) said bracket pair running from adjacent one end of said pot to no more than half way to the other end of said pot, and is duplicated by a second bracket pair running from the other end of said pot.

4. The structure according to claim 3 wherein the bars of each of said braces is tubular aluminum.

5. A desoldering vat comprising:
(a) an elongated solder pot for containing molten solder and having parallel sidewalls with upper edges defining a horizontal plane;
(b) means for heating solder in said pot to the molten state and maintaining same molten;
(c) a support brace having a bar with its upper side substantially at the level of said plane, whereby a circuit board can be rested across said bar and upper edges, with soldered component pins of a circuit board depending into said pot such that the heat from said molten solder melts the solder around said pins to free said component for removal from said board;
(d) the bar of said support brace running parallel to, and being spaced from, said pot; and
(e) said brace being adjustably spaced from said pot.

6. A desoldering vat comprising:
(a) an elongated solder pot for containing molten solder and having parallel sidewalls with upper edges defining a horizontal plane;
(b) means for heating solder in said pot to the molten state and maintaining same molten;
(c) a support brace having a bar with its upper side substantially at the level of said plane, whereby a circuit board can be rested across said bar and upper edges, with soldered component pins of a circuit board depending into said pot such that the heat from said molten solder melts the solder around said pins to free said component for removal from said board;

(d) the bar of said support brace running parallel to, and being spaced from, said pot;

(e) said brace being adjustably spaced from said pot;

(f) a base mounting said brace, said brace being mounted to an "L" shaped bracket slidably engaged on the edge of said base to make said brace adjustably spaced from said pot.

7. A desoldering vat comprising:

(a) an elongated solder pot for containing molten solder and having parallel sidewalls with upper edges defining a horizontal plane;

(b) means for heating solder in said pot to the molten state and maintaining same molten;

(c) a support brace having a bar with its upper side substantially at the level of said plane, whereby a circuit board can be rested across said bar and upper edges, with soldered component pins of a circuit board depending into said pot such that the heat from said molten solder melts the solder around said pins to free said component for removal from said board;

(d) the bar of said support brace running parallel to, and being spaced from, said pot; and, (e) said brace including a support post supporting and connected to said bar, and connected to said bar eccentrically thereof toward the end of said bar adjacent to the end of said pot.

8. A desoldering vat comprising:

(a) an elongated solder pot for containing molten solder and having parallel sidewalls with upper edges defining a horizontal plane;

(b) means for heating solder in said pot to the molten state and maintaining same molten;

(c) a support brace having a bar with its upper side substantially at the level of said plane, whereby a circuit board can be rested across said bar and upper edges, with soldered component pins of a circuit board depending into said pot such that the heat from said molten solder melts the solder around said pins to free said component for removal from said board; and, (d) the pot being on the order of ¼" wide measured from the outside of said parallel walls and said sidewalls being on the order of 0.1" thick, such that single row and double row leads may be de-soldered without dipping other leads on the same circuit board into the vat.

9. A desoldering vat comprising:

(a) an elongated solder pot for containing molten solder and having parallel sidewalls with upper edges defining a horizontal plane;

(b) means for heating solder in said pot to the molten state and maintaining same molten;

(c) a support brace having a bar with its upper side substantially at the level of said plane, whereby a circuit board can be rested across said bar and upper edges, with soldered component pins of a circuit board depending into said pot such that the heat from said molten solder melts the solder around said pins to free said component for removal from said board; and, (d) a planar safety spaced between said support bracket and the respective sidewalls, said safety guard extended substantially the entire length and height of the side of said pot, terminating just below the upper edge thereof.

10. The structure according to claim 9 wherein said support brace and safety guard are duplicated on opposite sides of said pot.

* * * * *